United States Patent
Boron et al.

(10) Patent No.: US 10,499,517 B2
(45) Date of Patent: Dec. 3, 2019

(54) DISPLAY ASSEMBLY WITH AN INTERNAL CASING

(71) Applicant: Delphi Technologies, LLC, Troy, MI (US)

(72) Inventors: Artur Boron, Czernichow (PL); Grzegorz Szostek, Morawica (PL)

(73) Assignee: Delphi Technologies, LLC, Troy, MI (US)

( * ) Notice: Subject to any disclaimer, the term of this patent is extended or adjusted under 35 U.S.C. 154(b) by 0 days.

(21) Appl. No.: 16/031,274

(22) Filed: Jul. 10, 2018

(65) Prior Publication Data

US 2019/0045641 A1 Feb. 7, 2019

(30) Foreign Application Priority Data

Aug. 1, 2017 (GB) .................................. 1712366.2

(51) Int. Cl.
*H05K 5/00* (2006.01)
*G02F 1/1333* (2006.01)
(Continued)

(52) U.S. Cl.
CPC ........... *H05K 5/0017* (2013.01); *B60K 35/00* (2013.01); *B60K 37/02* (2013.01); *G02F 1/133308* (2013.01); *H05K 5/0069* (2013.01); *H05K 5/0073* (2013.01); *H05K 7/20963* (2013.01); *B60K 2370/42* (2019.05); *B60K 2370/52* (2019.05); *B60K 2370/70* (2019.05); *B60K 2370/80* (2019.05); *B60K 2370/91* (2019.05);
(Continued)

(58) Field of Classification Search
CPC ............. H05K 5/0017; H05K 7/20963; H05K 5/0073; H05K 5/0069; H05K 9/0054; G02F 1/133308; G02F 2001/133334; G02F 1/133385; G02F 2001/13332; G02F 2001/133317; G02F 2001/133314; B60K 2350/352; B60K 35/00; B60K 2350/92
USPC ......................................................... 361/752
See application file for complete search history.

(56) References Cited

U.S. PATENT DOCUMENTS 9,389,449 B2 * 7/2016 Bang ................. G02F 1/133308
2009/0103257 A1 * 4/2009 Maeda ................... G06F 1/1616
361/679.27

(Continued)

FOREIGN PATENT DOCUMENTS

JP 2008287293 A 11/2008

*Primary Examiner* — Rockshana D Chowdhury
(74) *Attorney, Agent, or Firm* — Joseph V. Bonadies

(57) ABSTRACT

A display assembly for an automotive vehicle includes a housing having a front opening, a peripheral wall, and a rear wall arranged along a main axis. The housing is configured to receive a display module on a front opening side and a printed circuit board connected to the display module. The printed circuit board includes an electronic control unit to control the display module, characterized in that it further comprises an internal casing which is mounted in the housing against the housing rear wall, said internal casing comprising a first holding surface configured to receive the printed circuit board and a second holding surface configured to receive the display module, and in that the housing comprises a first set of axially retaining members holding the printed circuit board on the first holding surface and a second set of axially retaining members holding the display module on the second holding surface.

14 Claims, 3 Drawing Sheets

(51) Int. Cl.
*H05K 7/20* (2006.01)
*B60K 35/00* (2006.01)
*B60K 37/02* (2006.01)
*H05K 9/00* (2006.01)

(52) U.S. Cl.
CPC .................. *G02F 1/133385* (2013.01); *G02F 2001/13332* (2013.01); *G02F 2001/133314* (2013.01); *G02F 2001/133317* (2013.01); *G02F 2001/133334* (2013.01); *H05K 9/0054* (2013.01)

(56) References Cited

U.S. PATENT DOCUMENTS

| | | | |
|---|---|---|---|
| 2009/0180049 A1* | 7/2009 | Lee | G09F 9/35 |
| | | | 349/58 |
| 2011/0228458 A1* | 9/2011 | Richardson | H04M 1/0252 |
| | | | 361/679.01 |
| 2013/0258702 A1* | 10/2013 | Kim | G02B 6/0091 |
| | | | 362/602 |
| 2014/0002969 A1* | 1/2014 | Hwang | H05K 5/0017 |
| | | | 361/679.01 |
| 2016/0345045 A1* | 11/2016 | Liu | H04N 21/41422 |

* cited by examiner

DISPLAY ASSEMBLY WITH AN INTERNAL CASING

TECHNICAL FIELD OF INVENTION

This disclosure generally relates to the field of display assembly, and more particularly to a display assembly for use in an automotive vehicle.

BACKGROUND OF INVENTION

Automotive vehicles use more and more display modules such as liquid crystal display (LCD) modules to communicate various types of information to the users of the vehicles. Display modules are generally part of a display assembly including an external housing and a printed circuit board including an electronic control unit to control the display module. The external housing is generally made of a die cast metallic alloy such that it acts both as a back cover and as a heat sink to help dissipate thermal energy generated by some electronic component on the printed circuit board.

Display assemblies are arranged in multiple areas of the vehicle including the central panel and the cluster area of the vehicle. Additionally, the users demand display modules with high brightness.

Some of the issues that are faced when integrating display modules in the vehicle include the need for thermal dissipation, Mura-effect (i.e. clouding) avoidance, need to ensure mechanical stiffness and good EMC performance, and of course competitive cost structure while still providing display with high brightness.

Current display assemblies mainly use screws to fix the display module in a housing. Such solutions are not entirely satisfactory because fixation by screw introduce tension on the display module causing Mura-effect. Such Mura-effect is the result of non-planarity of the die cast constituting the external housing of the display assembly. Additionally, many screws are required to hold all parts of the display assembly together. Screw assembly is time consuming on production lines and generate significant assembly cost.

SUMMARY OF THE INVENTION

The present invention relates to a display assembly for an automotive vehicle comprising a housing having a front opening, a peripheral wall, and a rear wall arranged along a main axis, said housing being configured to receive a display module, such as a liquid crystal display module, on a front opening side and to contain a printed circuit board which is connected to the display module and which includes an electronic control unit to control the display module, characterized in that it further comprises an internal casing which is mounted in the housing against the housing rear wall, said internal casing comprising a first holding surface configured to receive the printed circuit board and a second holding surface configured to receive the display module, and in that the housing comprises a first set of axially retaining members holding the printed circuit board on the first holding surface and a second set of axially retaining members holding the display module on the second holding surface.

A merit of the present invention is to provide a display assembly which combines the technical advantages of plastic parts with the technical advantage of die cast metallic parts. The internal casing provides good mechanical stiffness to ensure good planarity to receive the display module, preventing Mura-effect, i.e. clouding. The internal casing acts as a heat sink to help with thermal dissipation from the printed circuit board and the electronic component mounted on the printed circuit board. The internal casing also provides shielding to ensure electromagnetic compatibility.

Another advantage of the present invention is that the display assembly is completed without need for screw which simplify the whole assembly. The display module, the printed circuit board, the internal casing are assembled altogether in the housing only by clipping.

According to other advantageous features of the invention:

- the axially retaining members extends substantially axially from the housing rear wall towards the housing front opening;
- the internal casing comprises a rear wall, a peripheral wall, and a front opening, said internal casing peripheral wall defining a first radial surface, between the internal casing rear wall and the internal casing front opening, said first radial surface forming the first holding surface;
- the internal casing peripheral wall comprises a set of apertures configured to give way to the first set of axially retaining members allowing them to grip a peripheral portion of the printed circuit board;
- the display module is mounted onto the radial front surface delimiting the internal casing front opening, said radial front surface forming the second holding surface;
- the internal casing front opening is provided with positioning members configured to cooperate with complementary positioning members arranged on the display module in view to secure the radial position of the display module on the internal casing;
- the internal casing front opening comprises a radial extension which extends outside the internal casing and at least one of the positioning member is arranged on a free end of the radial extension;
- the housing rear wall is provided with an aperture through which extends a rear portion of the internal casing;
- the housing is made of one piece of plastic material including the axially retaining members;
- the internal casing is made of one piece of die cast metallic alloy;
- the printed circuit board includes at least one electric connector which extends on the rear side of the printed circuit board through a connector aperture arranged in the internal casing rear wall;
- it further comprises a lid member which is mounted between the internal casing peripheral wall and the housing peripheral wall to secure at least some of the axially retaining members in their retaining position;
- said lid member comprises a radial extension which covers a peripheral portion of the display side of the display module.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example, with reference to the accompanying drawings, in which.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for describing embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

In the following description, similar components may be designated with the same reference number.

Figure 1:
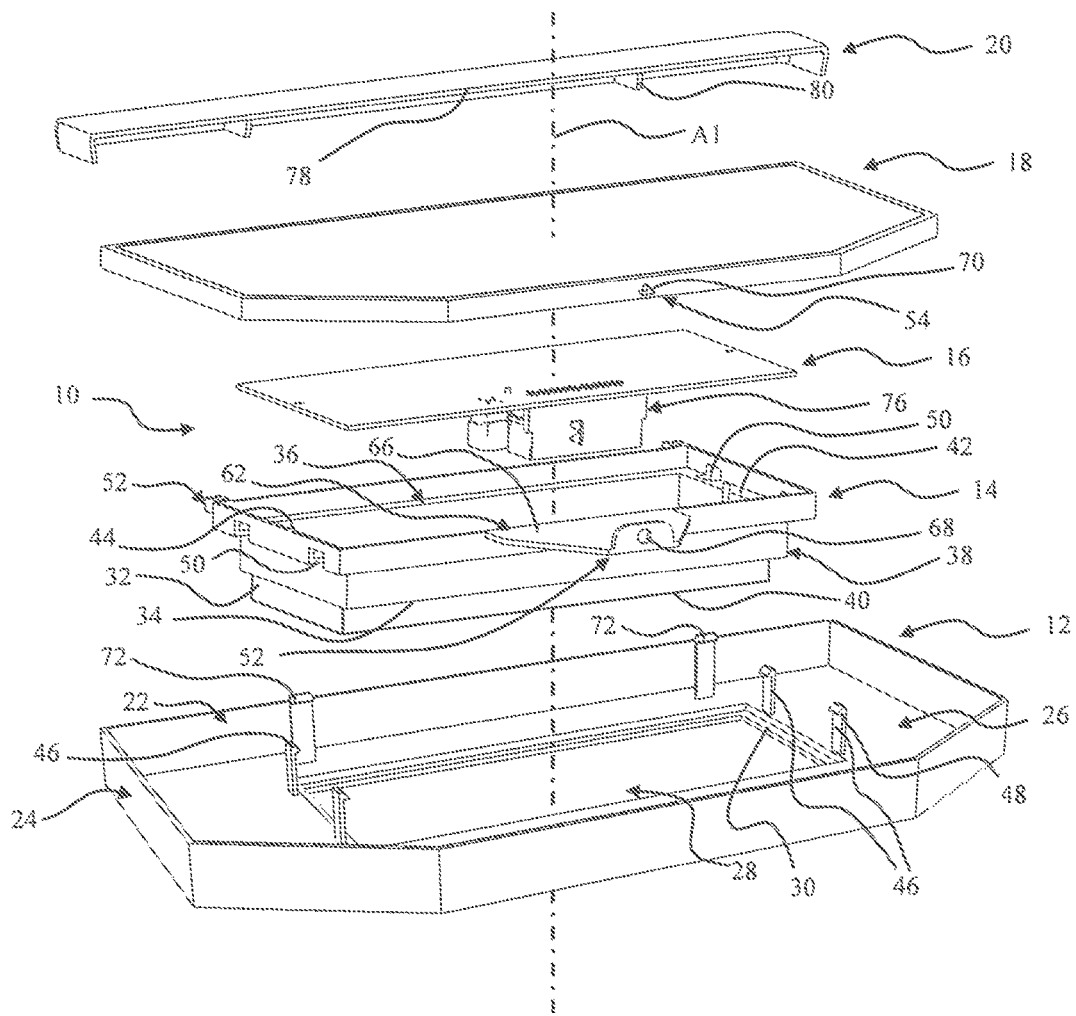
FIG. 1 is a perspective exploded view showing a display assembly including a housing, a printed circuit board, a display module, and an internal casing in accordance with a preferred embodiment of the invention.

FIG. 1 is an exploded perspective view of a display assembly 10 for an automotive vehicle in accordance with a preferred embodiment of the invention. The display assembly 10 comprises a housing 12 in which are stacked up an internal casing 14, a printed circuit board 16, a display module 18 and a lid member 20.

In the following description, without limiting purpose, an axial orientation along a main axis A1 corresponding to the stacking direction will be used arbitrarily. A radial orientation will also be used relative to the main axis A1. The main axis A1 will be oriented from the rear to the front corresponding to an orientation from the bottom to the top when looking at FIG. 1.

In the present embodiment, the housing 12 comprises a front opening 22, a peripheral wall 24 oriented axially, and a rear wall 26 substantially perpendicular to the main axis A1. The housing rear wall 26 is provided with a rear aperture 28 delimited by a rear shoulder portion 30. Said housing rear aperture 28 has a shape substantially complementary of a rear portion 32 of the internal casing 14, allowing said internal casing rear portion 32 to extend axially through said housing rear aperture 28. This arrangement is illustrated more particularly by FIGS. 2, 3 and 5.

Said internal casing 14 is designed to be inserted axially into the housing 12 and into the housing rear aperture 28 until a bearing surface 34 comes into abutment against the housing rear shoulder portion 30.

Figure 2:
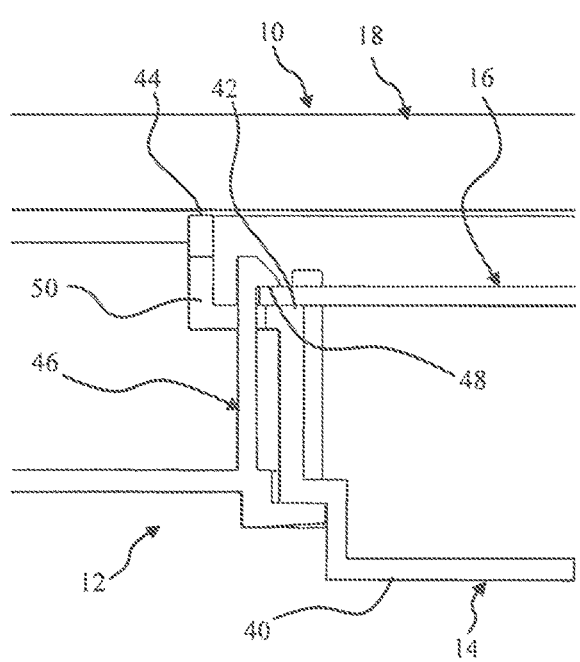
FIG. 2 is a cross section view showing a partial portion of the display assembly of FIG. 1, in particular an axially retaining member for the printed circuit board.
Figure 5:
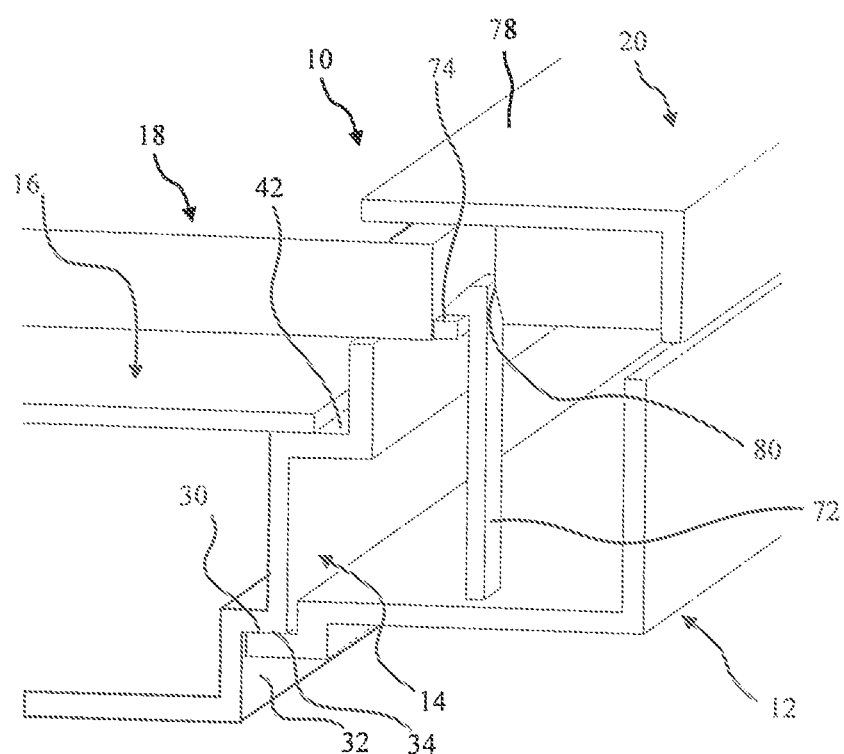
FIG. 5 is a perspective view with cross section showing a partial portion of the display assembly of FIG. 1, in particular a lid member securing an axially retaining member in a holding position.

Said internal casing 14 comprises a front opening 36, a peripheral wall 38 oriented substantially axially, and a rear wall 40 substantially perpendicular to the main axis A1. In the present embodiment, and as illustrated by FIGS. 2 and 5, said internal casing peripheral wall 38 comprises a front shoulder portion, or first radial surface, defining a first holding surface 42 configured to receive the printed circuit board 16 and a rear shoulder portion defining said bearing surface 34.

Advantageously, the internal casing front opening 36 is delimited by a radial front surface defining a second holding surface 44 configured to support the display module 18.

The printed circuit board 16 is held in position on the first holding surface 42 by a first set of axially retaining members 46. In the present embodiment, said first set of axially retaining members 46 is constituted of four resilient locking arms, or clips, extending axially from the housing rear wall 26 towards the housing front opening 22, on each side of the internal casing 14. Each axially retaining member 46 comprises a locking surface 48 oriented rearward and designed to be clipped over the front side 50 of the printed circuit board 16 to retain axially said printed circuit board 16 in position on said first holding surface 42.

Advantageously, said internal casing 14 is provided with lateral apertures 50 which allow the free end of each axially retaining member 46 to enter into the internal casing 14 to grab a peripheral portion of the printed circuit board 16.

Each axially retaining member 46 is designed to resiliently flex, or bend, radially outwardly when the printed circuit board 16 is inserted axially into the internal casing 14, and to bend back inwardly to their rest position shown on the figures wherein said axially retaining member 46 hold the printed circuit board 16 in position.

Figure 3:
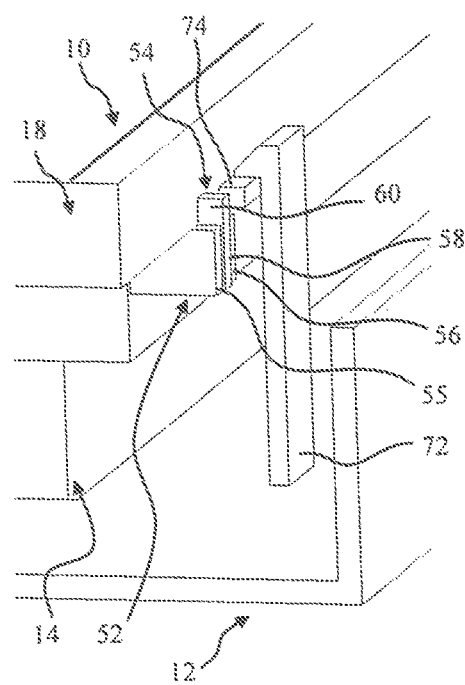
FIG. 3 is a perspective view with cross section showing a partial portion of the display assembly of FIG. 1, in particular an axially retaining member for the display module and a positioning member for the display module.
Figure 4:
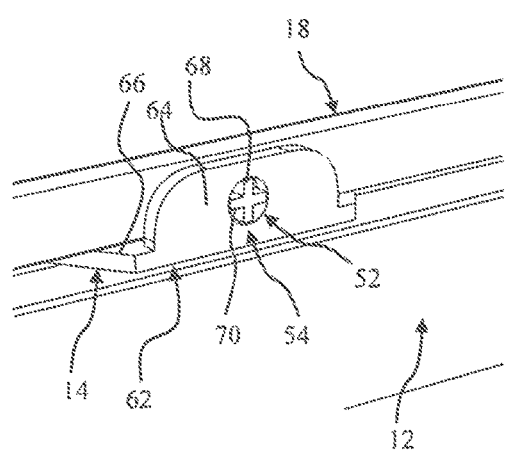
FIG. 4 is a perspective view showing a partial portion of the display assembly of FIG. 1, in particular a radial extension of the internal casing to receive the display module and a positioning member for the display module.

According to the present embodiment, as illustrated more particularly by FIGS. 3 and 4, the internal casing front opening 36 is provided with positioning members 52 arranged to cooperate with complementary positioning members 54 provided on the display module 18. Said internal casing positioning members 52 comprises on one side of the internal casing 14 two pairs of positioning ribs 55, 56 defining a positioning notch 58 designed to receive and secure in a radial or transverse plane, relative to the main axis A1, a complementary lug 60 arranged on a peripheral portion of the display module 18. Said complementary lug 60 is part of said display module complementary positioning members 54.

On the other side of the internal casing 14, the front opening 36 comprises a radial extension 62 which extends outside the internal casing 14 and which comprises an axial flange 64 provided with a positioning member 52. Said radial extension 62 comprises a radial surface 66 forming a support surface for the display module 18. In the present embodiment, the flange positioning member 52 is constituted of a circular hole 68 complementary to a pin 70 provided on a peripheral portion of the display module 18.

Of course, the positioning members 52, 54 could have different shapes, different numbers suitable to fulfill their function of positioning and retaining the display module 18 in place on the internal casing 14.

According to the present embodiment, a second set of axially retaining members 72 is provided on the housing rear wall 26. Said second set of axially retaining members 72 is substantially of the same shape as the first set of retaining members 46 and fulfill substantially the same function but for retaining axially the display module 18 instead of the printed circuit board 16.

Hence the second set of axially retaining members 72 comprises four resilient locking arms, or clips, each provided with a locking surface 48 designed to cooperate with a complementary locking surface 74 provided on a peripheral portion of the display module 18.

Advantageously, the housing 12 is made of plastic material by injection molding and the two sets of axially retaining members 46, 72 are made of one piece and in the same material with the housing 12.

Advantageously, the internal casing 14 is made of die cast metallic alloy in one piece, preferably of aluminum or magnesium alloy, in order to provide good shielding for electromagnetic compatibility and good thermal dissipation performance.

In accordance with the embodiment shown, the printed circuit board 16 includes an electronic control unit (not shown) to control the display module and some electrical connectors 76 mounted on its rear side to allow connecting the display module 18 and the printed circuit board 16 to an electronic circuit of the vehicle. Of course the printed circuit board 16 is connected to the display module 18 according to standard connecting means such as flex connectors or other types of connectors.

Advantageously, the internal casing rear wall 40 comprises connector apertures complementary to the electrical connectors 76 allowing them to extend axially towards the exterior of the housing 12 and allowing connection to complementary connectors (not shown) of the vehicle.

According to the present embodiment illustrated more particularly with FIG. 1 and FIG. 5, the lid member 20 is mounted between the internal casing peripheral wall 38 and the housing peripheral wall 24 to secure at least some of the axially retaining members 46, 72 in their retaining position. Said lid member 20 comprises a radial extension 78 which covers a peripheral portion of the display side of the display module 18.

As can be seen on FIG. 5, the lid member has an axial blocking surface 80 which engages with a lateral side of the axially retaining members 72 to prevent them from bending towards their "opened" position and prevent removal of the display module 18.

In addition to maintaining the parts together in the display assembly 10, the lid member 20 can also ensure good external appearance of the assembly by acting as a cover to hide the gap between the internal casing peripheral wall 38 and the housing peripheral wall 24. The lid member 20 can be secured by appropriate fitting means (not shown) on the housing peripheral wall 24.

The foregoing description and accompanying figures illustrate the principles and preferred embodiment of the invention. However, the invention should not be construed as being limited to the particular embodiment discussed above. Additional variations of the embodiment discussed above will be appreciated by those skilled in the art. In particular, the axially retaining members and/or the positioning members may have alternative designs. Also, the general shape of the housing and the general shape of the internal casing may have alternative designs.

We claim:

1. A display assembly (10) for an automotive vehicle comprising:
   a housing (12) having a front opening (22), a peripheral wall (24), and a rear wall (26) arranged along a main axis (A1), said housing (12) being configured to receive a display module (18) on a front opening side and to contain a printed circuit board (16) which is connected to the display module (18) and includes an electronic control unit to control the display module (18),
   wherein the display assembly (10) further comprises an internal casing (14) which is mounted in the housing (12) against the rear wall (26), said internal casing (14) comprising a first holding surface (42) configured to receive the printed circuit board (16) and a second holding surface (44) configured to receive the display module (18), and
   wherein the housing (12) comprises a first set of axially retaining members (46) holding the printed circuit board (16) on the first holding surface (42) and a second set of axially retaining members (72) holding the display module (18) on the second holding surface (44);
   wherein one or more of the first set of axially retaining members (46) comprises a locking surface (48) configured to be clipped over the printed circuit board (16) to retain the printed circuit board (16) on said first holding surface (42).

2. The display assembly (10) according to claim 1, wherein the first set of axially retaining members (46) and the second set of axially retaining members (72) extends substantially axially from the housing rear wall (26) towards the housing front opening (22).

3. The display assembly (10) according to claim 1, wherein the internal casing (14) comprises a rear wall (40), a peripheral wall (38), and a front opening (36), said internal casing peripheral wall (38) defining a first radial surface, between the internal casing rear wall (40) and the internal casing front opening (36), said first radial surface forming the first holding surface (42).

4. The display assembly (10) according to claim 3, wherein the internal casing peripheral wall (38) comprises a set of apertures (50) configured to give way to the first set of axially retaining members (46) allowing them to grip a peripheral portion of the printed circuit board (16).

5. The display assembly (10) according to claim 1, wherein the display module (18) is mounted onto the radial front surface delimiting the internal casing front opening (36), said radial front surface forming the second holding surface (44).

6. The display assembly (10) according to claim 5, wherein the internal casing front opening (36) is provided with positioning members (52) configured to cooperate with complementary positioning members (54) arranged on the display module (18) in view to secure a radial position of the display module (18) on the internal casing (14).

7. The display assembly (10) according to claim 6, wherein the internal casing front opening (36) comprises a radial extension (62) extends outside the internal casing (14) and in that at least one of the positioning members (52) is arranged on a free end of the radial extension (62).

8. The display assembly (10) according to claim 1, wherein the housing rear wall (26) is provided with an aperture (28) through which extends a rear portion (32) of the internal casing (14).

9. The display assembly (10) according to claim 1, wherein the housing (12) is made of one piece of plastic material including the first set of axially retaining members (46) and the second set of axially retaining members (72).

10. The display assembly (10) according to claim 1, wherein the internal casing (14) is made of one piece of die cast metallic alloy.

11. The display assembly (10) according to claim 1, wherein the printed circuit board (16) includes at least one electric connector (76) extends on the rear side of the printed circuit board (16) through a connector aperture arranged in the internal casing rear wall (40).

12. The display assembly (10) according to claim 1, wherein further comprises a lid member (78) which is mounted between the internal casing peripheral wall (38) and the housing peripheral wall (24) to secure at least some of the first set of axially retaining members (46) and the second set of axially retaining members (72) in a retaining position.

13. The display assembly (10) according to claim 12, wherein said lid member (78) comprises a radial extension (80) which covers a peripheral portion of the display side of the display module (18).

14. The display assembly (10) according to claim 1, wherein one or more of the second set of axially retaining members (72) comprises a locking surface (48) configured to be clipped over the display module (18) to retain the display module (18) on said second holding surface (44).

\* \* \* \* \*